(12) United States Patent
Yoo et al.

(10) Patent No.: US 9,184,343 B2
(45) Date of Patent: Nov. 10, 2015

(54) NANO STRUCTURE SEMICONDUCTOR LIGHT EMITTING DEVICE, AND SYSTEM HAVING THE SAME

(71) Applicant: Samsung Electronics Co., Ltd., Suwon-si (KR)

(72) Inventors: Geon Wook Yoo, Seongnam-si (KR); Jae Hyeok Heo, Suwon-si (KR); Sam Mook Kang, Osan-si (KR); Han Kyu Seong, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/455,853

(22) Filed: Aug. 8, 2014

(65) Prior Publication Data
US 2015/0155432 A1    Jun. 4, 2015

(30) Foreign Application Priority Data
Dec. 3, 2013    (KR) .......................... 10-2013-0149098

(51) Int. Cl.
| | |
|---|---|
| *H01L 51/50* | (2006.01) |
| *B82Y 20/00* | (2011.01) |
| *B82Y 40/00* | (2011.01) |
| *H01L 33/04* | (2010.01) |
| *H01L 33/08* | (2010.01) |
| *H01L 33/64* | (2010.01) |

(52) U.S. Cl.
CPC ................ *H01L 33/04* (2013.01); *H01L 33/08* (2013.01); *H01L 33/64* (2013.01)

(58) Field of Classification Search
CPC ................... H01L 2924/12041; H01L 27/153; H01L 33/04; H01L 33/06; H01L 51/5012; H01L 21/681; B82Y 30/00; B82Y 20/00; B82Y 40/00; B82Y 5/00; G02F 1/133603
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |

(Continued)

FOREIGN PATENT DOCUMENTS

| | | |
|---|---|---|
| KR | 10-2010-0087985 A | 8/2010 |
| KR | 10-2013-0024052 A | 3/2013 |

*Primary Examiner* — Thomas L Dickey
*Assistant Examiner* — Gustavo Ramallo
(74) *Attorney, Agent, or Firm* — Muir Patent Law, PLLC

(57) ABSTRACT

A nanostructure semiconductor light emitting device may include a substrate including a plurality of light emitting nanostructures comprising nanocores including a first conductivity type semiconductor, active layers and second conductivity type semiconductor layers sequentially formed on the nanocores. The light emitting region may include a first region and a second region. The interval between the light emitting nanostructures disposed in the first region may be different than the interval between the light emitting nanostructures disposed in the second region. The first region may be closer to a non-light emitting region than the second region and may have a smaller interval between the light emitting nanostructures than that of the second region. Systems implementing such a nanostructure semiconductor light emitting device and methods of manufacture are also disclosed.

20 Claims, 6 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,202,761 B2 | 6/2012 | Cho et al. |
| 8,263,987 B2 | 9/2012 | Choi et al. |
| 8,324,646 B2 | 12/2012 | Lee et al. |
| 8,350,251 B1 | 1/2013 | Lowgren et al. |
| 8,399,876 B2 | 3/2013 | Kim |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,847,199 B2 * | 9/2014 | Cha et al. ........................ 257/13 |
| 2008/0012030 A1 | 1/2008 | Yoon et al. |
| 2009/0159869 A1 | 6/2009 | Ponce et al. |
| 2011/0204327 A1 | 8/2011 | Hiruma et al. |
| 2011/0291069 A1 | 12/2011 | Kim |
| 2012/0153252 A1* | 6/2012 | Kim et al. ........................ 257/13 |
| 2013/0128362 A1 | 5/2013 | Song et al. |
| 2013/0161676 A1 | 6/2013 | Ikemoto et al. |
| 2014/0084800 A1* | 3/2014 | Lee ............................ 315/200 R |
| 2014/0124732 A1* | 5/2014 | Cha et al. ........................ 257/13 |
| 2014/0160754 A1* | 6/2014 | Lee et al. ...................... 362/237 |
| 2014/0203293 A1* | 7/2014 | Hwang et al. .................... 257/76 |
| 2014/0209858 A1* | 7/2014 | Cha et al. ........................ 257/13 |

* cited by examiner

NANO STRUCTURE SEMICONDUCTOR LIGHT EMITTING DEVICE, AND SYSTEM HAVING THE SAME

CROSS-REFERENCE TO RELATED APPLICATION

This application claims the benefit of Korean Patent Application No. 10-2013-0149098 filed on Dec. 3, 2013, with the Korean Intellectual Property Office, the disclosure of which is incorporated herein by reference.

BACKGROUND

The present disclosure relates to a nanostructure semiconductor light emitting device.

A semiconductor light emitting device such as a light emitting diode (LED) has a light emitting material, and may convert energy resulting from the combination of electrons and holes into light to be emitted therefrom. Currently, LEDs are widely used in lighting devices, display devices, and lighting sources, and the development thereof has been accelerated.

Recently, semiconductor light emitting devices using nanostructures and their manufacturing technologies have been suggested in order to increase light extraction efficiency through improvements in crystallinity and through an increased light emitting region. A relatively low amount of energy may dissipate in the form of heat in semiconductor light emitting devices having nanostructures, and the nanostructures provide an increased surface area.

SUMMARY

The present disclosure provides a nanostructure semiconductor light emitting device that emits a predetermined wavelength band of light. The present disclosure also provides a nanostructure semiconductor light emitting device that emits white light with a combination of plural wavelength bands of light emitting from different groups of nanostructures formed on a single substrate. The present disclosure also provides systems that implement the nanostructure semiconductor light emitting devices and related methods of manufacture.

According to an embodiment of the disclosure, there is provided a nanostructure semiconductor light emitting device comprising, a substrate including a light emitting region and a non-light emitting region. A plurality of light emitting nanostructures may be disposed in the light emitting region and include nanocores having a first conductivity type semiconductor, active layers disposed on the nanocores, and second conductivity type semiconductor layers disposed on the active layers. The light emitting region may include a first region and a second region, and the non-light emitting region may be disposed closer to the first region than the second region, and the interval between the light emitting nanostructures disposed in the first region may be smaller than the interval between the light emitting nanostructures disposed in the second region.

The interval between the light emitting nanostructures disposed in the first region may be determined by at least one of the interval between the light emitting nanostructures disposed in the second region and the area of the non-light emitting region.

The interval between the light emitting nanostructures disposed in the first region may be determined as a value formed by multiplying the interval between the light emitting nanostructures disposed in the second region by a predetermined compensation coefficient.

The non-light emitting region may include at least a portion of a first electrode connected to a plurality of the nanocores, at least a portion of a second electrode connected to the second conductivity type semiconductor layers, and at least a portion of a mesa region on the periphery of the light emitting region.

At least one of the first electrode and the second electrode may include a pad part and at least one finger part extended from the pad part.

The width of the first region may be 15% or less of the length or the width of the light emitting region.

The lateral surfaces of a plurality of the respective nanocores may be nonpolar m-planes.

The light emitting region may include a plurality of sub-regions emitting different wavelength bands of light from one another and at least one boundary region disposed between the sub-regions, and the width of the boundary region may be substantially identical to the interval between the light emitting nanostructures disposed in one sub-region of the plurality of sub-regions adjacent to the boundary region, or an average value of the intervals between the light emitting nanostructures disposed in respective sub-regions adjacent to the boundary region.

Some other embodiments are directed to a nanostructure semiconductor light emitting device comprising, a substrate including a non-light emitting region, a plurality of light emitting regions, and at least one boundary region disposed between the light emitting regions. A plurality of light emitting nanostructures may be disposed in the light emitting regions and include nanocores having a first conductivity type semiconductor, active layers disposed on the nanocores, and second conductivity type semiconductor layers disposed on the active layers. The intervals between the light emitting nanostructures disposed in the respective light emitting regions may be different from one another, and the width of the at least one boundary region may be substantially identical to the interval between the light emitting nanostructures included in one of the plurality of light emitting regions adjacent to the boundary region, or an average value of the intervals between the light emitting nanostructures disposed in the respective light emitting regions adjacent to the boundary region.

The plurality of light emitting regions may include a first light emitting region having a plurality of light emitting nanostructures spaced apart from one another by a first interval, a second light emitting region having a plurality of light emitting nanostructures spaced apart from one another by a second interval different from the first interval, and a third light emitting region having a plurality of light emitting nanostructures spaced apart from one another by a third interval different from the first interval and the second interval.

The nanocores disposed in the respective first, second, and third light emitting regions may have different widths or heights from one another.

The pluralities of light emitting nanostructures disposed in the respective first, second and third light emitting regions may generate different wavelength bands of light from one another.

The combination of the light having different wavelength bands generated by the pluralities of light emitting nanostructures disposed in the respective first, second and third light emitting regions may provide white light.

The width of the boundary region may have a value decreasing the distribution of the intervals between the light emitting nanostructures in the respective light emitting regions adjacent to the boundary region.

At least a portion of the plurality of light emitting regions may include a first region and a second region, and the non-light emitting region may be disposed closer to the first region than the second region, and the interval between the light emitting nanostructures disposed in the first region may be smaller than the interval between the light emitting nanostructures disposed in the second region.

Other embodiments contemplate a system comprising, a nanostructure semiconductor light emitting device, a power supply providing electric power to the nanostructure semiconductor light emitting device, and an output apparatus through which the light generated by the nanostructure semiconductor light emitting device may be emitted. The nanostructure semiconductor light emitting device may comprise a substrate including a first light emitting region, a second light emitting region and a non-light emitting region, and a plurality of light emitting nanostructures disposed in the first and the second light emitting regions, wherein the first light emitting region may be closer to the non-light emitting region than the second light emitting region, and the interval between the light emitting nanostructures disposed in the first light emitting region may be smaller than the interval between the light emitting nanostructures disposed in the second light emitting region.

The system may be an electronic system or a mechanical system. The output apparatus may be a display panel using the nanostructure semiconductor light emitting device as a light source. The output apparatus may be an optical lens modifying the path of the light generated by the nanostructure semiconductor light emitting device. The output apparatus may be a data communication apparatus using the nanostructure semiconductor light emitting device as a light source to communicate with another device or to send out information from the system.

The system may be a motor vehicle or a computer system. The nanostructure semiconductor light emitting device may comprise a plurality of light emitting sub-regions each of which emits different light waves and the combination of the light waves emitted by the plurality of light emitting sub-regions may compose white light.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
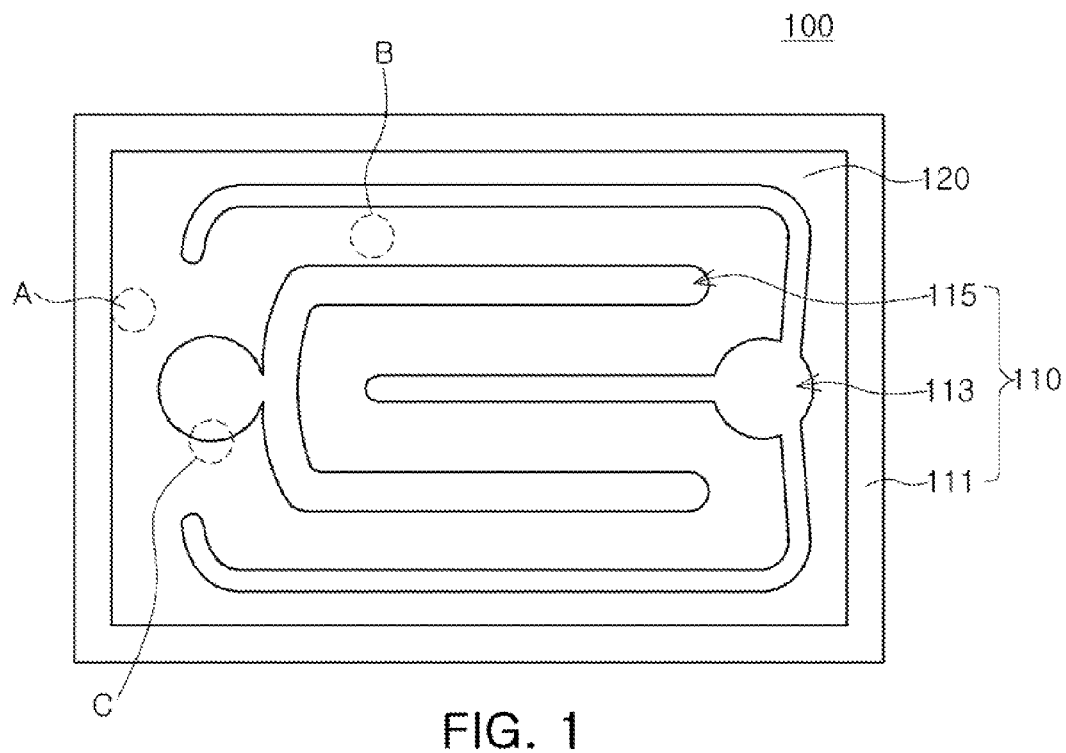
FIG. 1 is a plan view of a nanostructure semiconductor light emitting device according to an exemplary embodiment of the present disclosure.

Exemplary embodiments of the present disclosure will now be described in detail with reference to the accompanying drawings.

These exemplary embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the shapes and dimensions of elements may be exaggerated for clarity, and the same reference numerals will be used throughout to designate the same or like elements.

FIG. 1 is a plan view of a nanostructure semiconductor light emitting device according to an exemplary embodiment of the present disclosure.

Referring to FIG. 1, a nanostructure semiconductor light emitting device 100 may include a non-light emitting region 110 and a light emitting region 120 defined on a substrate. The light emitting region 120 may include a plurality of light emitting nanostructures connected to receive one or more electrical signals and emit light in response to the electrical signal(s). The non-light emitting region 110 may be defined as a region in which light emitting nanostructures are not disposed. As illustrated in the embodiment of FIG. 1, the non-light emitting region 110 may include a mesa region 111 on the periphery of the light emitting region 120, a first electrode 113, a second electrode 115, and the like. FIG. 1 illustrates a case in which each of the first electrode 113 and the second electrode 115 may include a pad part and at least one finger part extended from the pad part, but shapes of the electrodes are not limited to those illustrated in FIG. 1.

The respective first and second electrodes 113 and 115 may supply an electrical signal to the plurality of light emitting nanostructures in the light emitting region 120. The plurality of light emitting nanostructures may include nanocores including a first conductivity type semiconductor. Active layers and second conductivity type semiconductor layers may be formed on the nanocores sequentially. The first electrode 113 may be electrically connected to the nanocores and the second electrode 115 may be electrically connected to the second conductivity type semiconductor layers.

Some of the non-light emitting region 110 may be positioned in an interior area of the nanostructure semiconductor light emitting device 100, so that portions of the light emitting region 120 may surround this interior area. In addition, portions of the non-light emitting region 110 may surround the portions of the light emitting region 120. The non-light emitting region 110 may be positioned inside the light emitting region 120 as well as an outer edge of the light emitting region 120 in the nanostructure semiconductor light emitting device 100, such that a portion of the plurality of light emitting nanostructures disposed within the light emitting region 120 may be adjacent to the non-light emitting region 110. The nanocores including the first conductivity type semiconductor may be formed by growing a first conductivity type semiconductor layer disposed in the light emitting region 120.

In this case, the nanocores grown in a region adjacent to the non-light emitting region 110 may have a growth rate higher than that of the nanocores grown in a region distant from the non-light emitting region 110. Nanocores grown with a relatively higher growth rate may have diameters greater than diameters of nanocores grown with a relatively lower growth rate. Therefore, the diameters of the light emitting nanostructures may gradually decrease in size as they increase in distance from the non-light emitting region 110. The wavelengths of light emitted from the plurality of light emitting nanostructures may gradually shorten as they increase in distance from the non-light emitting region 110. For example, the light emitting nanostructures adjacent to the non-light emitting region 110 may have relatively large diameters and emit light having relatively long wavelengths, while the light emitting nanostructures distant from the non-light emitting region 110 may have relatively small diameters and emit light of relatively short wavelengths.

For example, the light emitting nanostructures disposed in region A may be closer to the mesa region of the non-light emitting region 110, as compared to the light emitting nanostructures disposed in region B. As a method of forming the light emitting nanostructures, a filling growth method may be used. The filling growth method may use a mask or mold having a predetermined thickness or more that is disposed on a semiconductor substrate. Openings in the mask may be filled with a nitride semiconductor material such as GaN to form the nanocores. The filling rate may depend on the distance from the non-light emitting region 110, whereby diameters of nanocores are not uniformly formed. Even in another manufacturing method of nanocores using a mask having a relatively small thickness, the diameters of nanocores may also be differently formed depending on the distance from the non-light emitting region 110 as described above. This manufacturing method may not be called as a filling growth method.

The opening patterns of the masks may be circular or hexagonal shapes. Alternatively, the opening patterns of the masks may have square shapes, rectangle shapes, pentagon shapes, linear trench shapes, etc.

The light emitting nanostructures disposed in region A may have diameters greater than that of the light emitting nanostructures disposed in region B. Consequently, the wavelengths of the light emitted from the light emitting nanostructures disposed in the respective regions A and B may be different from each other, and light having relatively long wavelengths may be generated in region A, whereby it may be difficult to generate light of desired/predetermined wavelengths in the entirety of the light emitting region 120.

For example, growth rates of the nanocores disposed in the respective regions A and B may be different from each other depending on distances from the non-light emitting region 110 to the regions A and B or portions thereof. The different growth rates may generate a difference in diameters of the nanocores. In some cases, the difference in the diameters of the nanocores may cause a difference in thicknesses of the active layers and the second conductivity type semiconductor layers of the light emitting nanostructures. In this case, in the light emitting nanostructures including the nanocores having relatively large diameters, the active layer thereof may be thinly formed and the portion of indium (In) in the composition may be decreased. Consequently, the wavelength of light emitted from the active layer may be shortened, such that approximately blue light may be emitted for example.

According to an exemplary embodiment of the present disclosure, the plurality of light emitting nanostructures may emit light having a substantially uniform wavelength in the entirety of the light emitting region 120 by adjusting the interval between the light emitting nanostructures included in the light emitting region 120. For example, an average value of intervals between nanostructures of a first group may be different from an average value of intervals between nanostructures of a second group. For example, in the case of region A in which the growth rate of nanocores is relatively high, the nanocores may be densely formed with smaller intervals therebetween than that between the nanocores of region B, whereby the difference in diameters of the nanocores disposed in regions A and B may be reduced.

In a case in which a plurality of nanocores is grown at a uniform interval without the adjustment of the interval as described above, the light emitting nanostructures disposed in region A may have diameters greater than those of the light emitting nanostructures disposed in region B, and the distribution of diameters (hereinafter, referred to as 'diameter distribution degree') of the respective light emitting nanostructures disposed in region A may be greater than that of the light emitting nanostructures disposed in region B. Therefore, the diameter distribution degree of the light emitting nanostructures may be increased in the overall light emitting region 120 to thereby make it difficult to obtain a desired wavelength. In an exemplary embodiment of the present disclosure, as the light emitting nanostructures are disposed to be closer to the non-light emitting region 110, the interval between the light emitting nanostructures adjacent to each other may get shorter and an increased number of the light emitting nanostructures may be disposed within the same area or per unit area. The diameter distribution degree of the light emitting nanostructures may be decreased and light of a desired wavelength may be efficiently generated throughout the light emitting region 120.

Figure 2A:
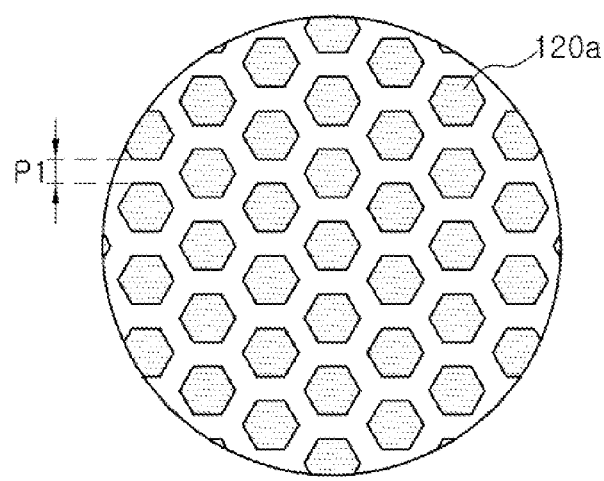
FIGS. 2A and 2B are expanded views illustrating regions A and B of the nanostructure semiconductor light emitting device illustrated in FIG. 1.
Figure 2B:
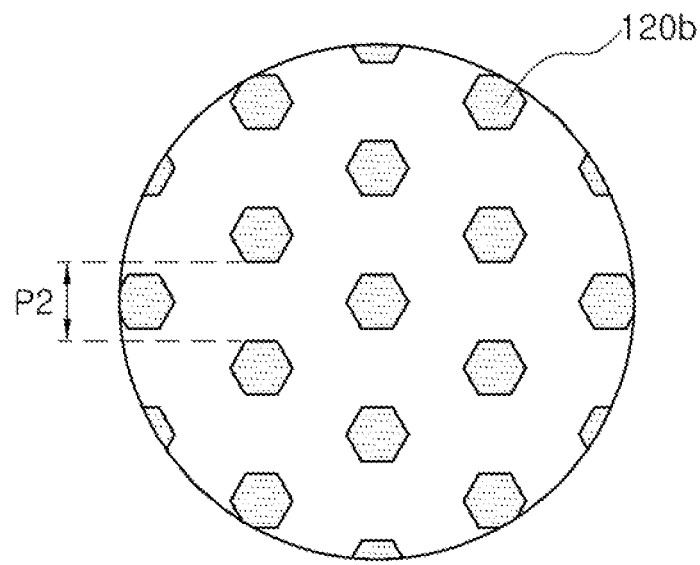

FIGS. 2A and 2B are expanded views illustrating regions A and B of the nanostructure semiconductor light emitting device illustrated in FIG. 1.

Referring to FIG. 2, diameters of the light emitting nanostructures 120*a* included in region A and the light emitting nanostructures 120*b* included in region B may be the same as each other. However, the interval or pitch P1 between the light emitting nanostructures 120*a* included in region A may be smaller than the interval or pitch P2 between the light emitting nanostructures 120*b* included in region B.

As described above, region A may be closer to the mesa region 111 of the non-light emitting region 110, as compared to region B. In a case in which the nanocores are simultaneously grown without the adjustment of process conditions or a modification of the distribution or the structure of the nanocores, the light emitting nanostructures 120*a* included in region A may have a diameter greater than that of the light emitting nanostructures 120*b* included in region B due to a the difference in growth rates thereof to thereby lead a difference in wavelengths of light emitted from the light emitting nanostructures 120*a* included in region A and the light emitting nanostructures 120*b* included in region B. The difference in diameters between the light emitting nanostructures 120*a* included in region A and the light emitting nanostructures 120*b* included in region B may be reduced to thereby obtain light having a uniform wavelength.

In an exemplary embodiment of the present disclosure, as illustrated in FIG. 2, the interval P1 between the light emitting nanostructures 120*a* and the interval P2 between the light emitting nanostructures 120*b* may be differently set according to distances from the non-light emitting region 110 to the respective regions A and B. In case the interval P1 is substantially same as the interval P2, the diameters of the light emitting nanostructures 120a in region A adjacent to the non-light emitting region 110 may be larger than those of the light emitting nanostructures 120b in region B due to the growth rate difference. Therefore, the interval P1 between the light emitting nanostructures 120a in region A may be set to be smaller than the interval P2 between the light emitting nanostructures 120b in region B, which may lead the diameters of the nanostructures in the region A to be substantially same as the diameters of the nanostructures in the region B. In a case in which the interval P1 is smaller than the interval P2, the density of the light emitting nanostructures 120a in region A may be greater than the density of the light emitting nanostructures 120b in region B, such that the difference in diameters between the light emitting nanostructures 120a and 120b may be significantly reduced.

The interval P1 between the light emitting nanostructures 120a and the interval P2 between the light emitting nanostructures 120b may be differently set according to the distances from the non-light emitting region 110 to the respective regions A and B. Accordingly, the diameter distribution degree of the light emitting nanostructures 120a and 120b may be decreased in the overall light emitting region 120. As described above, the difference in diameters between the light emitting nanostructures 120a and 120b may lead to the difference in wavelengths of light emitted from the light emitting nanostructures 120a and 120b. Therefore, the diameter distribution degree of the light emitting nanostructures 120a and 120b may be decreased to implement light of a desired wavelength band.

In FIGS. 2A and 2B, the top down view of the nanostructures shows hexagonal shape, but it is not limited thereto. For example, the cross-sectional shape of the nanostructures may be circular, square, rectangular, pentagonal, etc. The nanostructures may also have a linear shape.

Figure 3:
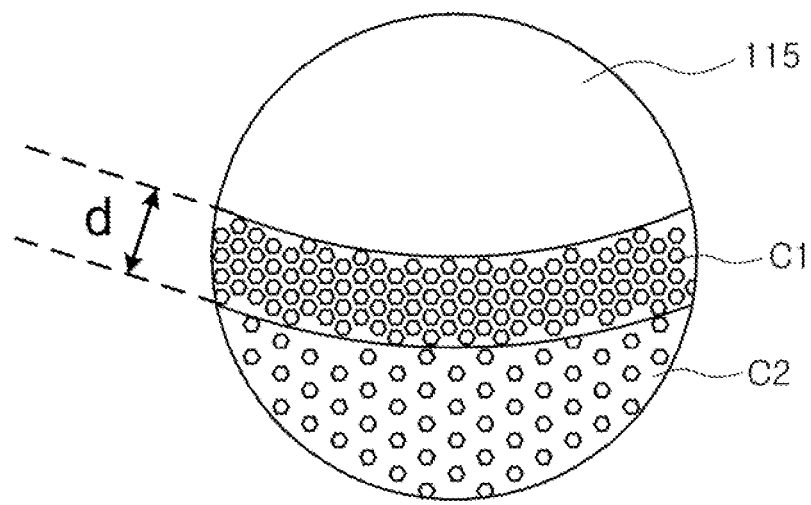
FIG. 3 is an expanded view illustrating region C of the nanostructure semiconductor light emitting device illustrated in FIG. 1.

FIG. 3 is an expanded view illustrating region C of the nanostructure semiconductor light emitting device illustrated in FIG. 1.

Referring to FIG. 3, region C may include first and second regions C1 and C2 included in the light emitting region 120 and a portion of the second electrode 115 of the non-light emitting region 110. The second electrode 115 may be included in the non-light emitting region 110 and have no light emitting nanostructures grown therein. A plurality of light emitting nanostructures may be disposed within the first and second regions C1 and C2. As described above, the plurality of light emitting nanostructures may include nanocores including the first conductivity type semiconductor, and active layers and second conductivity type semiconductor layers sequentially formed on the nanocores.

Referring to FIG. 3, the first and second regions C1 and C2 in the region C may be included in the light emitting region 120 and have a plurality of light emitting nanostructures disposed therein. In this case, since the first region C1 may be relatively closer to the second electrode 115 of the non-light emitting region 110, as compared to the second region C2, the growth rate of the light emitting nanostructures disposed in the first region C1 may be higher than that of the light emitting nanostructures disposed in the second region C2. Accordingly, in order to significantly decrease the difference in diameters of the light emitting nanostructures caused by the difference between the growth rate of the light emitting nanostructures disposed in the first region C1 and the growth rate of the light emitting nanostructures disposed in the second region C2, the interval between the light emitting nanostructures disposed in the first region C1 may be set to be smaller than the interval between the light emitting nanostructures disposed in the second region C2.

The interval between the light emitting nanostructures disposed in the first region C1 may be determined by at least one of the interval between the light emitting nanostructures disposed in the second region C2 and the area of the non-light emitting region 110. By way of example, the interval between the light emitting nanostructures disposed in the first region C1 may be determined as a value formed by multiplying the interval between the light emitting nanostructures disposed in the second region C2 by a predetermined compensation coefficient $\alpha$. In this case, the compensation coefficient $\alpha$ may be a value determined by the wavelength of light to be generated by the nanostructure semiconductor light emitting device, the area of the non-light emitting region 110, the area of the light emitting region 120, or the like.

The first region C1 may be closer to the second electrode 115 of the non-light emitting region 110, as compared to the second region C2. In the overall light emitting region 120, a portion thereof adjacent to the non-light emitting region 110 may have a small interval between the light emitting nanostructures in a similar manner to the case of the first region C1. In this case, the width d of the first region C1 may have a value determined by the wavelength of light to be generated by the nanostructure semiconductor light emitting device, the interval between the light emitting nanostructures disposed in the second region C2, the area of the non-light emitting region 110, the area of the light emitting region 120, or the like, in a similar manner to the case of the compensation coefficient $\alpha$.

By way of example, in a case in which the interval between the light emitting nanostructures disposed in the second region C2 is 2.8 μm, the compensation coefficient $\alpha$ may be in the range of 0.8 to 0.95, such as about 0.9, and the width d of the first region C1 may be 6 μm. That is, the interval between the light emitting nanostructures disposed in the first region C1 may be 2.5 μm. In a case in which the light emitting nanostructures are formed at the same interval without use of the compensation coefficient $\alpha$ and the width of the first region C1, the difference in diameters may be about 150 nm or more between the light emitting nanostructures adjacent to a the boundary and the ones formed in about 40 μm away from the boundary. Here, the boundary is between the non-light emitting region 110 and the light emitting region 120. This diameter differences may cause about 20 nm or more wavelength difference between the light emitted by the respective nanostructures. However, when the compensation coefficient $\alpha$ and the width d of the first region C1 is appropriately set and applied, light of a desired wavelength may be uniformly generated.

In this example, the width d of the first region C1 may be set to be 15% or less of the length or the width of the light emitting region 120. When the width d of the first region C1 is set to be excessively large, the diameter of the light emitting nanostructures disposed in the first region C1 to be adjacent to a boundary thereof with the second region C2 may be smaller than that of the light emitting nanostructures disposed in the second region C2. Thus, shorter wavelengths than those desired may be generated from the nanostructures formed in the first region C1 adjacent to the boundary thereof with the second region C2. Therefore, the width d of the first region C1 may be set to be 15% or less of the length or the width of the light emitting region 120 to enhance the generation of desired light waves.

In FIG. 3, the top down view of the nanostructures shows a hexagonal shape, but the shape is not limited thereto. For example, the cross-sectional shape of the nanostructures may be circular, square, rectangular, pentagonal, etc. The nanostructures may also have a wall shape.

Figure 4:
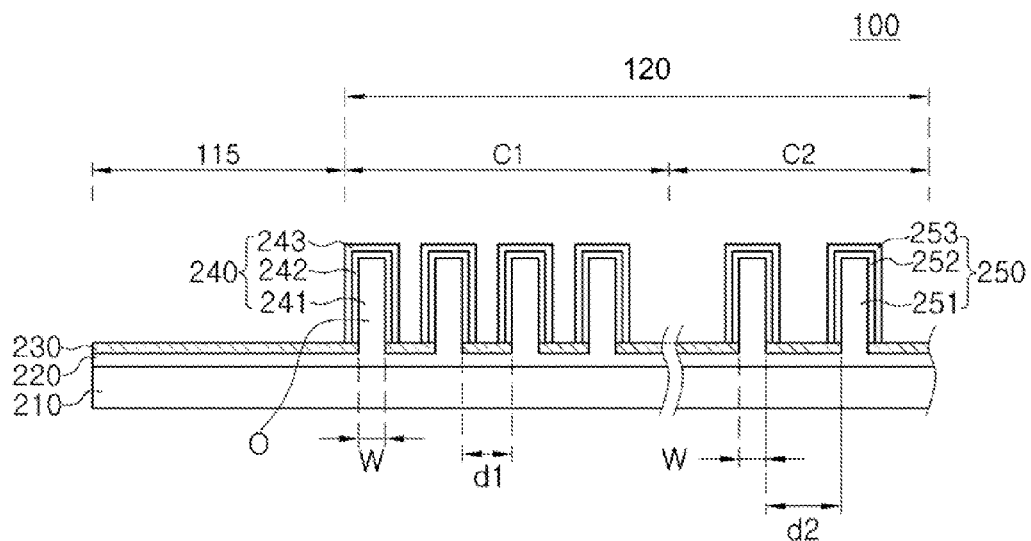
FIG. 4 is a cross-sectional view of the nanostructure semiconductor light emitting device according to an exemplary embodiment of the present disclosure.

FIG. 4 is a cross-sectional view illustrating region C of the nanostructure semiconductor light emitting device illustrated in FIG. 1.

Referring to FIG. 4, the non-light emitting region 110 at the second electrode 115 has no light emitting nanostructures formed therein, and only the first and second regions C1 and C2 of the light emitting region 120 have light emitting nanostructures 240 and 250 formed therein. As illustrated in FIG. 4, the nanostructure semiconductor light emitting device 100 may include a substrate 210, a base layer 220 provided on the substrate 210, an insulating layer 230 provided on the base layer 220, and a plurality of the light emitting nanostructures 240 and 250 formed on the base layer 220.

The base layer 220 may be formed on the substrate 210. The base layer 220 may provide a surface for growing the light emitting nanostructures 240 and 250 and serve to electrically connect the terminals of the plurality of the light emitting nanostructures 240 and 250 to the same to one another and to provide an electrical signal (e.g., positive or negative voltage) to these terminals.

The substrate 210 may be an insulating substrate, a conductive substrate or a semiconductor substrate. For example, the substrate 210 may be formed of sapphire, SiC, Si, $MgAl_2O_4$, MgO, $LiAlO_2$, $LiGaO_2$, or GaN. The base layer 220 may be a nitride semiconductor satisfying $Al_xIn_yGa_{1-x-y}N$ ($0 \leq x \leq 1$, $0 \leq y \leq 1$, $0 \leq x+y \leq 1$) and may be doped with an n-type impurity such as silicon (Si) to have a specific conductivity type.

The insulating layer 230 may be prepared on the base layer 220 and provide a plurality of openings O to have the plurality of light emitting nanostructures 240 and 250 formed therein. The insulating layer 230 may be a kind of mask layer having a plurality of openings O formed therein. The insulating layer 230 having the plurality of openings O may be disposed on the base layer 220 and the base layer 220 may be grown through the plurality of openings O to thereby form nanocores 241 and 251. The nanocores 241 and 251 may include a first conductivity type semiconductor and for example, the first conductivity type semiconductor may include N-type GaN. Lateral surfaces of the nanocores 241 and 251 may be nonpolar m-planes. Meanwhile, the insulating layer 230 may include an insulating material such as silicon oxide, silicon nitride or the like. By way of example, the insulating layer 230 may include a material such as $SiO_2$, SiN, $TiO_2$, $Si_3N_4$, $Al_2O_3$, TiN, AlN, $ZrO_2$, TiAlN, TiSiN or the like.

Active layers 242 and 252 and second conductivity type semiconductor layers 243 and 253 may be sequentially formed on the nanocores 241 and 251. The active layers 242 and 252 may have a multiple quantum well (MQW) structure in which quantum well and quantum barrier layers are alternately stacked and for example, in the case of a nitride semiconductor, a GaN/InGaN structure may be used but a single quantum well (SQW) structure may also be used. The second conductivity type semiconductor layers 243 and 253 may be crystalline satisfying a composition of p-type $Al_xIn_yGa_{1-x-y}N$.

The active layers 242 and 252 may be formed to cover the lateral surfaces and top surfaces of the nanocores 241 and 251. In an exemplary embodiment, the active layers 242 and 252 may be formed on the surfaces of the nanocores 241 and 251, respectively, through a batch process. In a case in which the nanocores 241 and 251 have different diameters from each other, the active layers 242 and 252 may have different compositions under the same manufacturing conditions, due to differences in lattice constants, specific surface areas, and strains, such that wavelengths of light generated by the respective light emitting nanostructures 240 and 250 may be changed. Specifically, in a case in which the quantum well layers configuring the active layer is formed of $In_xGa_{1-x}N$ ($0 \leq x \leq 1$), the content of indium (In) may vary depending on the nanocores having different diameters. As a result, the wavelengths of the light emitted from the respective quantum well layers may be changed.

That is, in order to implement light of a desired wavelength in the nanostructure semiconductor light emitting device 100, the diameter distribution degree of the nanocores 241 and 251 may be significantly reduced in the light emitting region 120. However, because diameters of the light emitting nanostructures 240 and 250 may be increased towards the non-light emitting region 110 without any adjustment as described above, the interval between the light emitting nanostructures 240 and the interval between the light emitting nanostructures 250 may be adjusted to significantly reduce the diameter distribution degree.

Referring to FIG. 4, the interval between the first light emitting nanostructures 240 disposed in the first region C1 adjacent to the second electrode 115 of the non-light emitting region 110 may be set as d1, and the interval between the second light emitting nanostructures 250 disposed in the second region C2 may be set as d2. The interval d1 may be smaller than the interval d2, and the first light emitting nanostructures 240 may be disposed in the first region C1 at a higher density as compared to the second light emitting nanostructures 250 disposed in the second region C2. Therefore, widths W of the nanocores 241 and 251 included in the first and second light emitting nanostructures 240 and 250 may have almost the same value, despite of the difference in growth rate in the first region C1 and the second region C2.

Meanwhile, the second conductivity type semiconductor layers 243 and 253 may further include electron blocking layers (not shown) in portions thereof adjacent to the active layers 242 and 252, respectively. The electron blocking layers may have a structure in which a plurality of n-type $Al_xIn_yGa_{1-x-y}N$ layers having different compositions is stacked, or may have at least one layer configured of $Al_yGa_{(1-y)}N$. The electron blocking layers may have a band gap greater than that of the active layers 242 and 252 to prevent electrons from being transferred to the second conductivity type semiconductor layers 243 and 253.

The second conductivity type semiconductor layers 243 and 253 may include GaN doped with a p-type impurity, unlike the nanocores 241 and 251 including the first conductivity type semiconductor. Silicon (Si) may be doped in the nanocores 241 and 251 as the n-type impurity. The p-type impurity applied to the second conductivity type semiconductor layers 243 and 253 may be Zn, Cd, Be, Mg, Ca, Ba or the like, and may be mainly, Mg or Zn.

A manufacturing method of a nanostructure semiconductor light emitting device is described herein after with reference to FIGS. 1 and 4. The structures and the materials described above may not be described repeatedly. However, the structures and the materials described in other embodiments may be applied to the manufacturing method of the present embodiment.

A conductor layer may be formed on the substrate 210. The conductor layer may be formed by a sputtering method and patterned to form a first electrode 113, a second electrode 115 and a mesa pattern 111. The first electrode 113, the second electrode 115 and the mesa pattern 111 may be formed by a photolithography method. A first photosensitive layer may be formed on the conductor layer and a photolithography process may be used to form patterns 111, 113 and 115. A portion of the first photosensitive layer may be exposed to an ultra violet (UV) light by using a photo mask to make a pattern. The exposed first photosensitive layer may be developed by a developer to pattern the first photosensitive layer. The first photosensitive layer may include a positive type photosensitive material or a negative type photosensitive material. The conductor layer may be etched by an etchant. The etchant may be a gas or a liquid. After the conductor layer is etched to form the patterns 111, 113 and 115, the first photosensitive layer is removed. The first photosensitive layer may be removed by asking and/or stripping the first photosensitive layer. The conductor layer may be formed by chemical mechanical planarization (CMP) process. The conductor layer may include copper, silver, gold or aluminum.

A base layer 220 may be formed on the substrate 210 and the conductor patterns 111, 113 and 115. The base layer 220 may be formed by a chemical vapor deposition (CVD) process, an epitaxial growth method or a spin coating method. The base layer 220 may be patterned to electrically contact to one of the first electrode 113 and the second electrode 115, and to insulate from the other. The base layer 220 may be patterned by a photolithography process.

An insulating layer 230 may be formed on the base layer 220. The insulating layer 230 may be formed by CVD, epitaxial growth, or spin coating, for example. The insulating layer 230 may be patterned to form openings O in the insulating layer 230, such as by photolithography. A second photosensitive layer may be coated on the insulating layer 230 when a photolithography method is used to form the openings O. A portion of the second photosensitive layer may be exposed to a UV light by using a photo mask, and the second photosensitive layer may be patterned by a developer. The second photosensitive layer may include a positive type photosensitive material or a negative type photosensitive material. The photo mask may have a higher density of patterns in the corresponding region to the region C1 than the patterns in the corresponding region to the region C2. The insulating layer 230 may be etched to form the openings O. A gas etchant or a liquid etchant may be used to etch the insulating layer 230. The second photosensitive layer may be removed by asking and/or stripping process.

Nanocores 241 and 251 may be formed in the openings O. The nanocores 241 and 251 may be formed by an epitaxial growth method. An active layer, a second conductivity type semiconductor layer and a third photosensitive layer may be coated sequentially on the insulating layer 230 and the nanocores 241 and 251. The active layer and the second conductivity layer may be formed by a CVD process. The photosensitive layer may be formed by a spin coating process. The third photosensitive layer may be exposed to a UV light by using a photo mask, and the third photosensitive layer may be patterned by a developer. The third photosensitive layer may include a positive type photosensitive material or a negative type photosensitive material. The photo mask may have a higher density of patterns in the corresponding region to the region C1 than the patterns in the corresponding region to the region C2. The second conductivity layer may be etched to form second conductivity layer patterns 243 and 253. The active layer may be etched to form active layer patterns 242 and 252. The second conductivity layer patterns and the active layer patterns may be formed by a batch process. The second conductivity layer patterns and the active layer patterns may be formed by two separate processes. Gas etchants and/or liquid etchants may be used to etch the second conductivity layer and/or the active layer. The third photosensitive layer may be removed by asking and/or stripping process. Even though the active layer and the second conductivity layer are described to be formed by one photolithography process, it is also possible that the second conductivity layer is formed by another photolithography process after the active layer patterns 242 and 252 are formed.

The second conductivity layer patterns 243 and 253 may be electrically connected one another, and they may be electrically connected to one of the first electrode 113 and the second electrode 115. The base layer 220 may be electrically connected to the other electrode, and may be insulated from the electrode which is electrically connected to the second conductivity layer patterns 243 and 253.

The conductor layer including the electrode patterns 113, 115 and the mesa pattern 111 may be formed under the base layer 220 or over the insulating layer 230. Alternatively, one electrode pattern may be formed under the base layer 220, and the other electrode pattern may be formed over the insulating layer 230.

Figure 5:
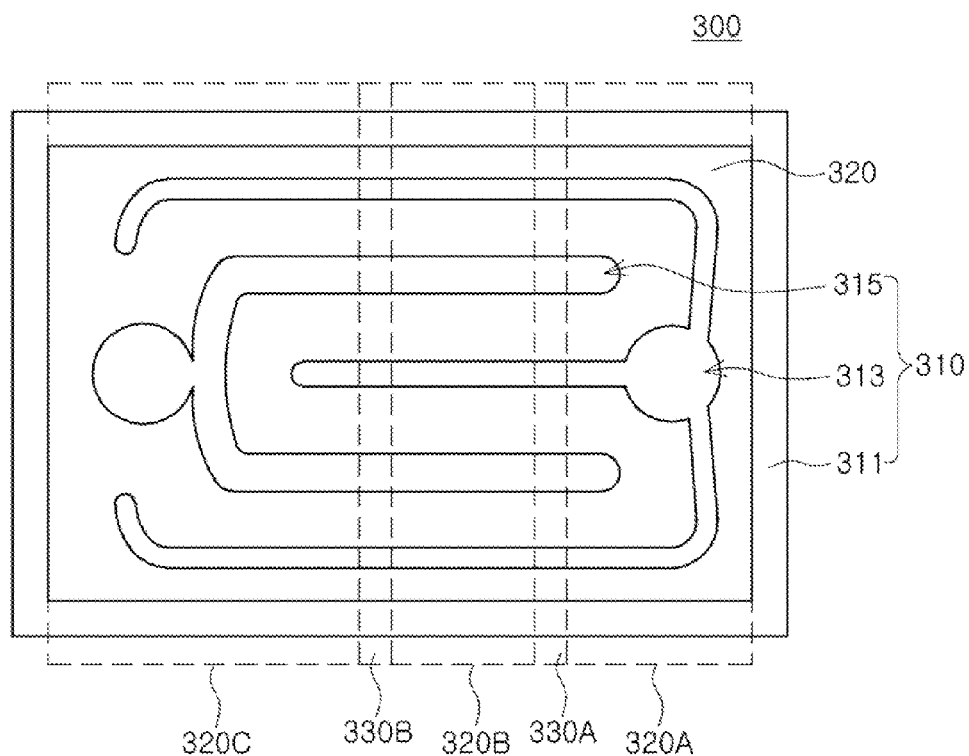
FIG. 5 is a plan view of a nanostructure semiconductor light emitting device according to another exemplary embodiment of the present disclosure.

FIG. 5 is a plan view of a nanostructure semiconductor light emitting device according to another exemplary embodiment of the present disclosure.

Referring to FIG. 5, a nanostructure semiconductor light emitting device 300 may include a non-light emitting region 310 and a light emitting region 320. In particular, in a similar manner to the case of the nanostructure semiconductor light emitting device 100 illustrated in FIG. 1, the non-light emitting region 310 may include a mesa region 311 on the periphery of the light emitting region 320, a first electrode 313, and a second electrode 315.

Referring to FIG. 5, the light emitting region 320 may be divided into a plurality of light emitting regions 320A, 320B, and 320C and the respective light emitting regions 320A, 320B, and 320C may generate light having different wavelengths from one another. For example, a first light having a first wavelength may be generated in a first light emitting region 320A. A second light having a second wavelength different from the first wavelength may be generated in a second light emitting region 320B. A third light having a third wavelength different from the first and second wavelengths may be generated in a third light emitting region 320C. In particular, the first, the second and the third light may be mixed or combined to thereby provide white light. In this case, white light may be output from the single nanostructure semiconductor light emitting device 300.

In the exemplary embodiment of FIG. 5, intervals between the light emitting nanostructures disposed in the respective first, second, and third light emitting regions 320A, 320B, and 320C may be intentionally set to be different in order to generate light having different wavelengths in the respective first, second, and third light emitting regions 320A, 320B and 320C. For example, the intervals between the light emitting nanostructures disposed in the respective first, second, and third light emitting regions 320A, 320B, and 320C may be set to be different from one another by 200 nm or more. Under the conditions described above, the nanostructure semiconductor light emitting device 300 may output white light.

A first boundary region 330A may be disposed between the first light emitting region 320A and the second light emitting region 320B, and a second boundary region 330B may be disposed between the second light emitting region 320B and the third light emitting region 320C. The first and second boundary regions 330A and 330B may have different widths and in this case, the widths of the boundary regions 330A and 330B may be set to have values capable of significantly decreasing distributions of intervals (hereinafter, referred to as "interval distribution degrees") between the light emitting nanostructures included in the respective light emitting regions 320A, 320B and 320C, adjacent to the corresponding boundary regions 330A and 330B.

For example, the width of the first boundary region 330A may be set to have a value capable of significantly decreasing the interval distribution degrees of the light emitting nanostructures disposed in the respective first and second light emitting regions 320A and 320B. This is because that the width of the first boundary region 330A may affect a portion of the first light emitting region 320A and a portion of the second light emitting region 320B near the first boundary region 330A, whereby the interval distribution degrees of the light emitting nanostructures disposed in the respective first and second light emitting regions 320A and 320B may vary according to the width of the first boundary region 330A. With regard to this, a description thereof will be given later, with reference to FIGS. 7A through 7C.

FIG. 5 shows an example of nanostructure semiconductor light emitting device which has three light emitting regions 320A, 320B and 320C. Another embodiment may have two light emitting regions having different intervals between the nanostructures, and may emit white color or another in combination with the wavelength bands emitting from each light emitting region. Some other embodiments may have four or more light emitting regions having different intervals between the nanostructures formed in different light emitting regions, and may emit white color or another in combination with the wavelength bands emitting from each light emitting region.

Figure 6:
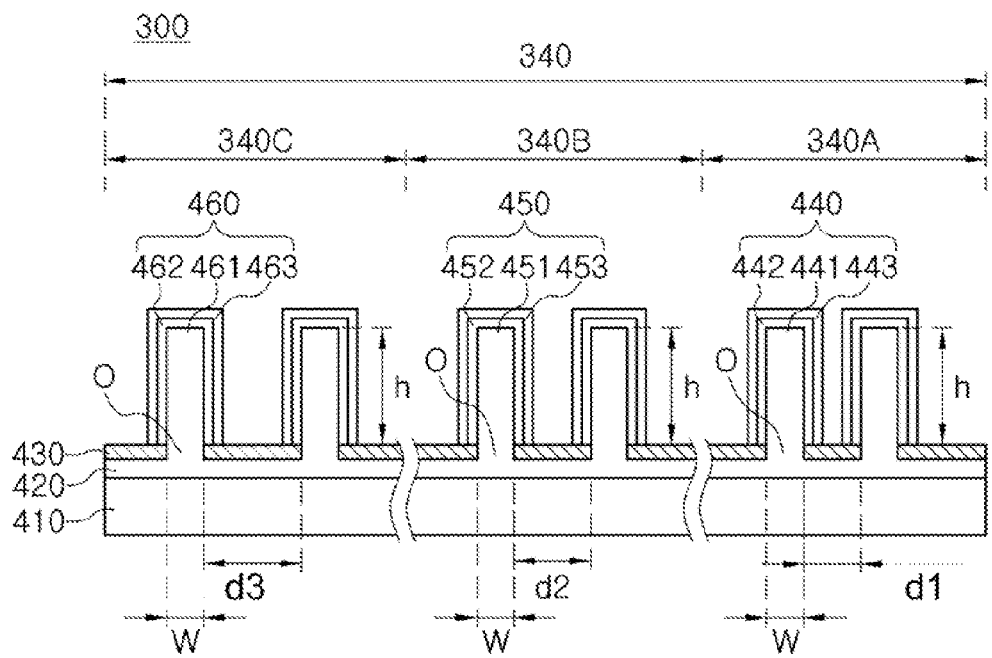
FIG. 6 is a cross-sectional view of the nanostructure semiconductor light emitting device of FIG. 5.

FIG. 6 is a cross-sectional view of the nanostructure semiconductor light emitting device of FIG. 5.

Referring to FIG. 6, the nanostructure semiconductor light emitting device 300 may include a substrate 410, a base layer 420 provided on the substrate 410, an insulating layer 430 provided on the base layer 420, and a plurality of light emitting nanostructures 440, 450 and 460 formed on the base layer 420. The light emitting region 320 may be divided into the first, second, and third light emitting regions 320A, 320B and 320C, and the plurality of light emitting nanostructures 440, 450 and 460 may be disposed in the first, second, and third light emitting regions 320A, 320B and 320C, respectively.

The base layer 420 may be formed on the substrate 410. The base layer 420 may provide a surface for growing the light emitting nanostructures 440, 450 and 460 and serve to electrically connect the terminals of the plurality of the light emitting nanostructures 440, 450 and 460 to one another.

The substrate 410 may be an insulating substrate, a conductive substrate or a semiconductor substrate. For example, the substrate 410 may be formed of sapphire, SiC, Si, MgAl$_2$O$_4$, MgO, LiAlO$_2$, LiGaO$_2$, or GaN. The base layer 420 may be a nitride semiconductor satisfying Al$_x$In$_y$Ga$_{1-x-y}$N (0≤x≤1, 0≤y≤1, 0≤x+y≤1) and may be doped with an n-type impurity such as silicon (Si) to have a specific conductivity type.

The insulating layer 430 may be prepared on the base layer 420 and may provide a plurality of openings O to have the plurality of light emitting nanostructures 440, 450 and 460 formed therein. The insulating layer 430 may be a kind of mask layer having the plurality of openings O formed therein. The insulating layer 430 having the plurality of openings O may be disposed on the base layer 420 and the base layer 420 may be grown through the plurality of openings O to thereby form nanocores 441, 451 and 461. The nanocores 441, 451 and 461 may include a first conductivity type semiconductor and for example, the first conductivity type semiconductor may include N-type GaN. Lateral surfaces of the nanocores 441, 451 and 461 may be nonpolar m-planes. Meanwhile, the insulating layer 430 may include an insulating material such as silicon oxide, silicon nitride or the like. By way of example, the insulating layer 430 may include a material such as SiO$_2$, SiN, TiO$_2$, Si$_3$N$_4$, Al$_2$O$_3$, TiN, AlN, ZrO$_2$, TiAlN, TiSiN or the like.

Active layers 442, 452 and 462 and second conductivity type semiconductor layers 443, 453 and 463 may be sequentially formed on the nanocores 441, 451 and 461. The active layers 442, 452 and 462 may have a multiple quantum well (MQW) structure in which quantum well and quantum barrier layers are alternately stacked and for example, in the case of a nitride semiconductor, a GaN/InGaN structure may be used but a single quantum well (SQW) structure may also be used. The second conductivity type semiconductor layers 443, 453 and 463 may be crystalline (e.g., single crystals) satisfying a composition of p-type Al$_x$In$_y$Ga$_{1-x-y}$N.

The active layers 442, 452 and 462 may be formed to cover the lateral surfaces and top surfaces of the nanocores 441, 451 and 461. In an exemplary embodiment, the active layers 442, 452 and 462 may be formed on the surfaces of the nanocores 441, 451 and 461 respectively through a batch process. In a case in which the nanocores 441, 451 and 461 have different diameters or heights from one another, the active layers 442, 452 and 462 may have different compositions under the same manufacturing condition due to differences in lattice constants, specific surface areas, and strains, such that wavelengths of light generated by the respective light emitting nanostructures 440, 450 and 460 may be changed. Specifically, in a case in which the quantum well layers configuring the active layer are formed of In$_x$Ga$_{1-x}$N (0≤x≤1), the content of indium (In) may vary depending on the nanocores having different diameters or heights. As a result, the wavelengths of the light emitted from the respective quantum well layers may be changed.

In the exemplary embodiment illustrated in FIG. 6, the intervals between the light emitting nanostructures 440, 450 and 460 disposed in the respective first, second, and third light emitting regions 320A, 320B, and 320C may be set to be different from one another in order to generate light having different wavelengths in the respective first, second, and third light emitting regions 320A, 320B and 320C. FIG. 6 illustrates a case in which the interval d1 between the first light emitting nanostructures 440 is the smallest while the interval d3 between the third light emitting nanostructures 460 is the largest, and the interval d2 between the second light emitting nanostructures 450 is larger than the interval d1 and smaller than the interval d3. The light emitting nanostructures 440, 450 and 460 may be also prepared in other forms like different orders or different positions than the one shown in FIG. 6.

In an exemplary embodiment, the interval d1 between the first light emitting nanostructures 440 may be 1000~1200 nm, the interval d2 between the second light emitting nanostructures 450 may be 1200~1600 nm, and the interval d3 between the third light emitting nanostructures 460 may be 1600~2300 nm. In addition that the intervals d1, d2, and d3 are set to satisfy the numerical ranges above, the differences between the intervals d1, d2, and d3 may be set to be at least 200 nm or more, so that white light may be provided from the single nanostructure semiconductor light emitting device 300. Meanwhile, FIG. 6 illustrates a case in which widths w and heights h of the nanocores 441, 451 and 461 included in the first, second, and third light emitting nanostructures 440, 450 and 460 have substantially the same values. Unlike the case, the widths and the heights of the nanocores 441, 451 and 461 may be adjusted, such that the wavelengths of the light generated by the respective light emitting nanostructures 440, 450 and 460 may be different from one another. By way of example, as the intervals between the nanocores 441, 451 and 461 increase or the diameters of the respective nanocores 441, 451 and 461 decrease, the thicknesses of the active layers 442, 452 and 462 included in the light emitting nanostructures 440, 450 and 460 may increase, so that the indium (In) ratio may increase in the active layer composition. Accordingly, the respective light emitting nanostructures 440, 450 and 460 may emit light of longer wavelengths. Meanwhile, in terms of the heights of the nanocores 441, 451 and 461, the thicknesses of the active layers 442, 452 and 462 may increase as the heights of the nanocores 441, 451 and 461 decrease, such that the indium (In) ratio of the composition included in the active layers 442, 452 and 462 may increase. Accordingly, the wavelengths of light emitted from the respective light emitting nanostructures 440, 450 and 460 may lengthen as the heights of the nanocores 441, 451 and 461 decrease. On the other hand, the wavelengths of light emitted from the respective light emitting nanostructures 440, 450 and 460 may shorten as the heights of the nanocores 441, 451 and 461 increase.

Meanwhile, the second conductivity type semiconductor layers 443, 453 and 463 may further include electron blocking layers (not shown) in portions thereof adjacent to the active layers 442, 452 and 462, respectively. The electron blocking layers may have a structure in which a plurality of n-type $Al_xIn_yGa_{1-x-y}N$ layers having different compositions is stacked, or may have at least one layer configured of $Al_yGa_{(1-y)}N$. The electron blocking layers may have a band gap greater than that of the active layers 442, 452 and 462 to prevent electrons from being transferred to the second conductivity type semiconductor layers 443, 453 and 463.

The second conductivity type semiconductor layers 443, 453 and 463 may include GaN doped with a p-type impurity, unlike the nanocores 441, 451 and 461 including the first conductivity type semiconductor. Silicon (Si) may be used as the n-type impurity included in the nanocores 441, 451 and 461 as a doping material. The p-type impurity applied to the second conductivity type semiconductor layers 443, 453 and 463 may be Zn, Cd, Be, Mg, Ca, Ba or the like, and may be mainly, Mg or Zn.

A manufacturing method of a nanostructure semiconductor light emitting device is described herein after with reference to FIGS. 5 and 6. The structures and the materials described above may not be described repeatedly. However, the structures and the materials described in other embodiments may be applied to the manufacturing method of the present embodiment.

A conductor layer may be formed on the substrate 410. The conductor layer may be formed by a sputtering method and patterned to form a first electrode 313, a second electrode 315 and a mesa pattern 311. The first electrode 313, the second electrode 315 and the mesa pattern 311 may be formed by a photolithography method. A fourth photosensitive layer may be applied on the conductor layer when a photolithography method is used to form the patterns 311, 313 and 315. A portion of the fourth photosensitive layer may be exposed to a UV light by using a photo mask to make a pattern. The exposed fourth photosensitive layer may be developed by a developer. The fourth photosensitive layer may include a positive type photosensitive material or a negative type photosensitive material. The conductor layer may be etched by an etchant. The etchant may be a gas or a liquid. After the conductor layer is etched to form the patterns 311, 313 and 315, the fourth photosensitive layer may be removed. The fourth photosensitive layer may be removed by asking and/or stripping the fourth photosensitive layer. The conductor layer may be formed by CMP process. The conductor layer may include copper, silver, gold or aluminum.

A base layer 420 may be formed on the substrate 410 and the conductor patterns 311, 313 and 315. The base layer 420 may be formed by a CVD process, a PECVD process, an epitaxial growth method or a spin coating method. The base layer 420 may be patterned to electrically contact to one of the first electrode 313 and the second electrode 315, and to insulate from the other. The base layer 420 may be patterned by a photolithography process.

An insulating layer 430 may be formed on the base layer 420. The insulating layer 430 may be formed by a CVD, an epitaxial growth, a spin coating, or a sputtering method. The insulating layer 430 may be patterned to form openings O in the insulating layer 430. A photolithography method may be used to form the openings O in the insulating layer 430. A fifth photosensitive layer may be coated on the insulating layer 430 when a photolithography method is used to form the openings O. A portion of the fifth photosensitive layer may be exposed to a UV light by using a photo mask, and the fifth photosensitive layer may be patterned by a developer. The fifth photosensitive layer may include a positive type photosensitive material or a negative type photosensitive material. The photo mask may have denser patterns in the corresponding region to the region 340A than the patterns in the corresponding region to the region 340B. The photo mask may again have denser patterns in the corresponding region to the region 340B than the patterns in the corresponding region to the region 340C. The insulating layer 430 may be etched to form the openings O. A gas etchant or a liquid etchant may be used to etch the insulating layer 430. The fifth photosensitive layer may be removed by asking and/or stripping process.

Nanocores 441, 451 and 461 may be formed in the openings O. The nanocores 441, 451 and 461 may be formed by an epitaxial growth method. An active layer, a second conductivity type semiconductor layer and a sixth photosensitive layer may be coated sequentially on the insulating layer 430 and the nanocores 441, 451 and 461. The active layer and the second conductivity layer may be formed by a CVD process. The photosensitive layer may be formed by a spin coating process. The sixth photosensitive layer may be exposed to a UV light by using a photo mask, and the sixth photosensitive layer may be patterned by a developer. The sixth photosensitive layer may include a positive type photosensitive material or a negative type photosensitive material. The photo mask may have denser patterns in the corresponding region to the region 340A than the patterns in the corresponding region to the region 340B. The photo mask may again have denser patterns in the corresponding region to the region 340B than the patterns in the corresponding region to the region 340C. The second conductivity layer may be etched to form second conductivity layer patterns 443, 453 and 463. The active layer may be etched to form active layer patterns 442, 452 and 462. The second conductivity layer patterns and the active layer patterns may be formed by a batch process. The second conductivity layer patterns and the active layer patterns may be formed by two separate processes. Gas etchants and/or liquid etchants may be used to etch the second conductivity layer and/or the active layer. The sixth photosensitive layer may be removed by asking and/or stripping process. Even though the active layer and the second conductivity layer are described to be formed by one photolithography process, it is also possible that the second conductivity layer is formed by another photolithography process after the active layer patterns 442, 452 and 462 are formed.

The second conductivity layer patterns 443, 453 and 463 may be electrically connected one another, and they may be electrically connected to one of the first electrode 313 and the second electrode 315. The base layer 420 may be electrically connected to the other electrode, and may be insulated from the electrode which is electrically connected to the second conductivity layer patterns 443, 453 and 463. The photo masks used in the processes forming the active layer patterns 442, 452 and 462 and/or the insulating layer 430 may have different dense of patterns in the boundary between the regions 340A, 340B, and 340C. The photo masks used in the processes forming the active layer patterns 442, 452 and 462 and/or the insulating layer 430 may have denser patterns at a closer area to the first and the second electrodes 313 and 315 than a farther area from the first and the second electrodes 313 and 315.

The conductor layer including the electrode patterns 313, 315 and the mesa pattern 311 may be formed under the base layer 420 or over the insulating layer 430. Alternatively, one electrode pattern may be formed under the base layer 420, and the other electrode pattern may be formed over the insulating layer 430.

Figure 7A:
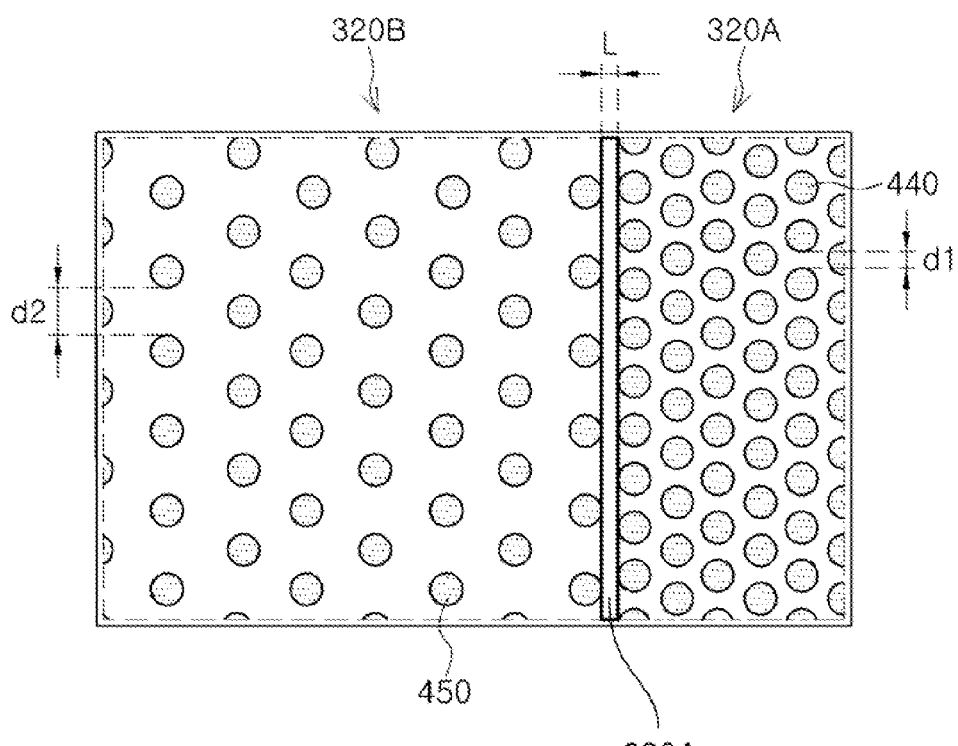
FIGS. 7A through 7C are expanded plan views for describing the nanostructure semiconductor light emitting device of FIG. 5.
Figure 7B:
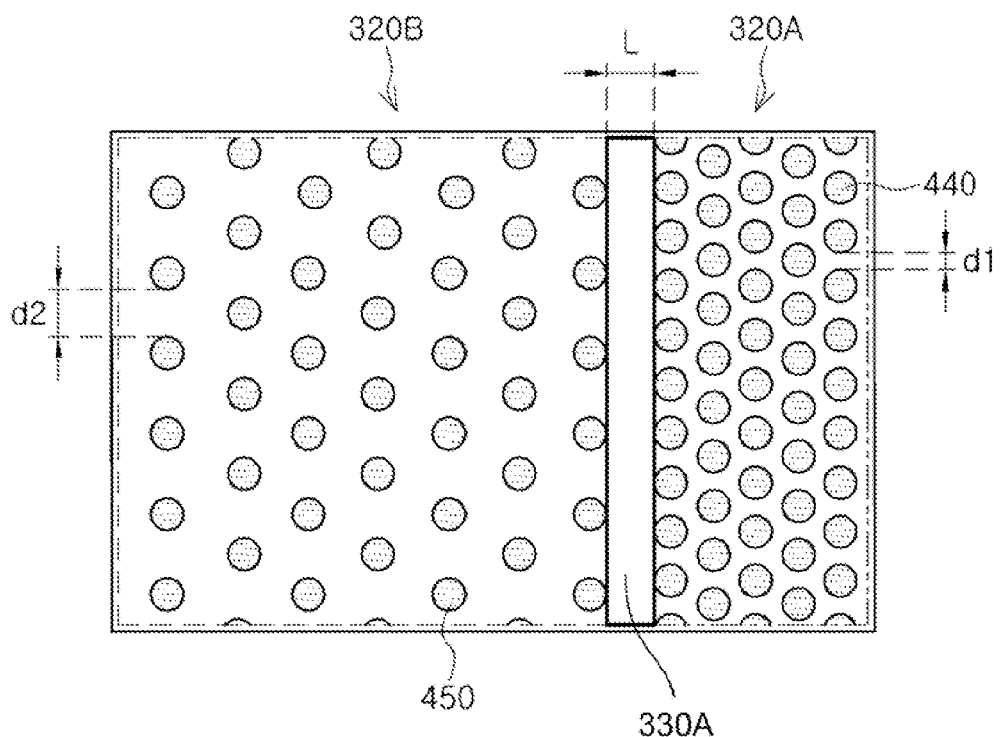
Figure 7C:
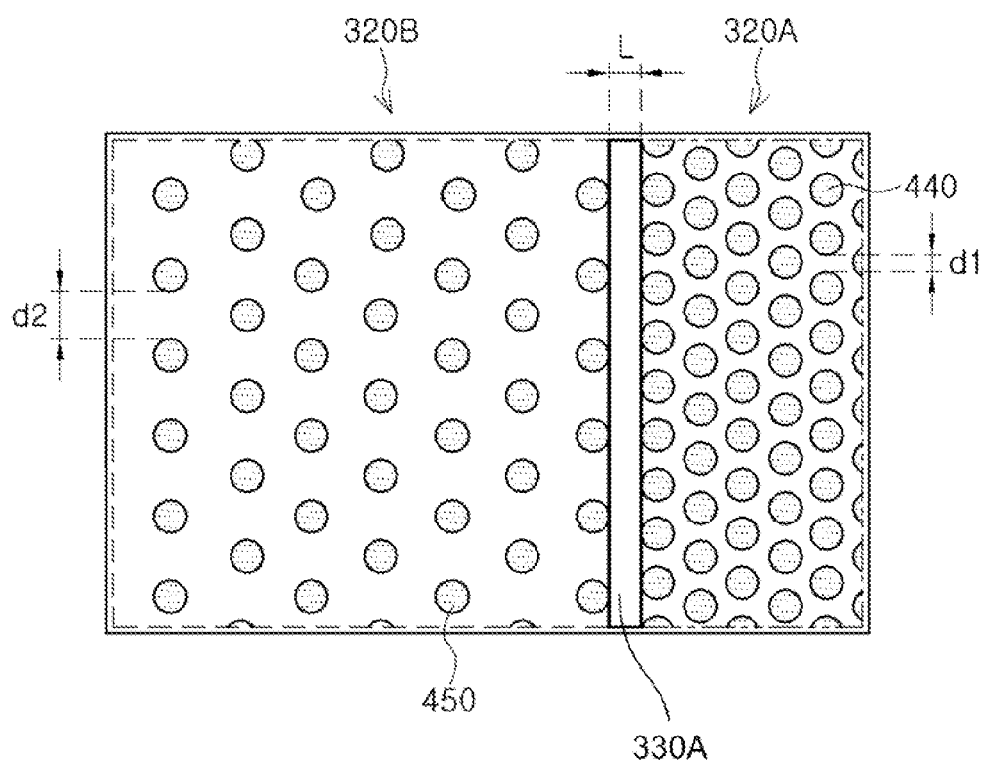

FIGS. 7A through 7C are plan views for describing the nanostructure semiconductor light emitting device of FIG. 5.

FIGS. 7A through 7C are views for describing a method for setting the width L of the first boundary region 330A defined between the first light emitting region 320A and the second light emitting region 320B in the nanostructure semiconductor light emitting device illustrated in FIG. 5. FIGS. 7A through 7C illustrate the first light emitting region 320A, the second light emitting region 320B, and the first boundary region 330A disposed therebetween. The exemplary embodiment of the present disclosure described with reference to FIGS. 7A through 7C may also be applied to the second light emitting region 320B, the third light emitting region 320C, and the second boundary region 330B disposed therebetween.

Referring to FIG. 7A, first, the plurality of light emitting nanostructures 440 and 450 having substantially the same diameters may be disposed in the first and the second light emitting regions 320A and 320B respectively. The first light emitting nanostructures 440 disposed in the first light emitting region 320A may be positioned at a relatively small interval, as compared to the second light emitting nanostructures 450 disposed in the second light emitting region 320B. That is, the interval d1 between the first light emitting nanostructures 440 may be smaller than the interval d2 between the second light emitting nanostructures 450.

In the exemplary embodiment of FIG. 7A, the width L of the first boundary region 330A may have the same value as the interval d1 between the first light emitting nanostructures 440 disposed in the first light emitting region 320A. Thus, the influence of the first boundary region 330A on the first light emitting region 320A may be extremely insignificant. However, the first boundary region 330A may significantly affect the interval d2 between the second light emitting nanostructures 450 disposed in the second light emitting region 320B, and the distribution degree of the interval d2 between the second light emitting nanostructures 450 disposed in the second light emitting region 320B may be increased.

Next, referring to FIG. 7B, the width L of the first boundary region 330A may have the same value as the interval d2 between the second light emitting nanostructures 450 disposed in the second light emitting region 320B. Thus, in contrast with the example of FIG. 7A, the influence of the first boundary region 330A on the second light emitting region 320B may be reduced. However, the distribution degree of the interval d1 between the first light emitting nanostructures 440 disposed in the first light emitting region 320A may be increased.

Finally, referring to FIG. 7C, the width L of the first boundary region 330A may be determined to have an average value of the interval d1 between the first light emitting nanostructures 440 and the interval d2 between the second light emitting nanostructures 450. Thus, unlike the examples of FIGS. 7A and 7B, the first boundary region 330A may affect both of the intervals d1 and d2.

However, the increase in the distribution degree of the interval d2 that may be generated in the example of FIG. 7C may be smaller than the increase in the distribution degree of the interval d2 that may be generated in the example of FIG. 7A. In a similar manner, the increase in the distribution degree of the interval d1 that may be generated in the example of FIG. 7C may be smaller than the increase in the distribution degree of the interval d1 that may be generated in the example of FIG. 7B.

That is, as described in the examples of FIGS. 7A through 7C, the distribution degrees of the intervals d1 and d2 adjacent to the first boundary region 330A may be increased according to the width L of the first boundary region 330A. Since the increases in the distribution degrees of the intervals d1 and d2 may affect the wavelengths of the light emitted from the first and second light emitting regions 320A and 320B, the width of the first boundary region 330A may be set in consideration of the wavelengths of light to be obtained from the nanostructure semiconductor light emitting device 300. In a similar manner, the width of the second boundary region 330B disposed between the second and the third light emitting regions 320B and 320C may be set.

As set forth above, according to exemplary embodiments of the present disclosure, distribution of sizes of the light emitting nanostructures may be reduced in the entirety of the light emitting region by adjusting intervals between the light emitting nanostructures adjacent to the non-light emitting region in the nanostructure semiconductor light emitting device. Further, in the nanostructure semiconductor light emitting device having a plurality of light emitting regions that generate light with a plurality of wavelength bands, the width of the boundary region between the light emitting regions may be set to significantly decrease distribution of intervals between the light emitting nanostructures disposed in the respective light emitting regions, whereby light of desired wavelengths may be effectively implemented.

In FIGS. 7A, 7B and 7C, the top down view of the nanocores shows circular shape, but it is not limited thereto. For example, the cross-sectional shape of the nanocores may be square, rectangular, pentagonal, hexagonal, etc. The nanocores may also have a linear shape.

Figure 8:
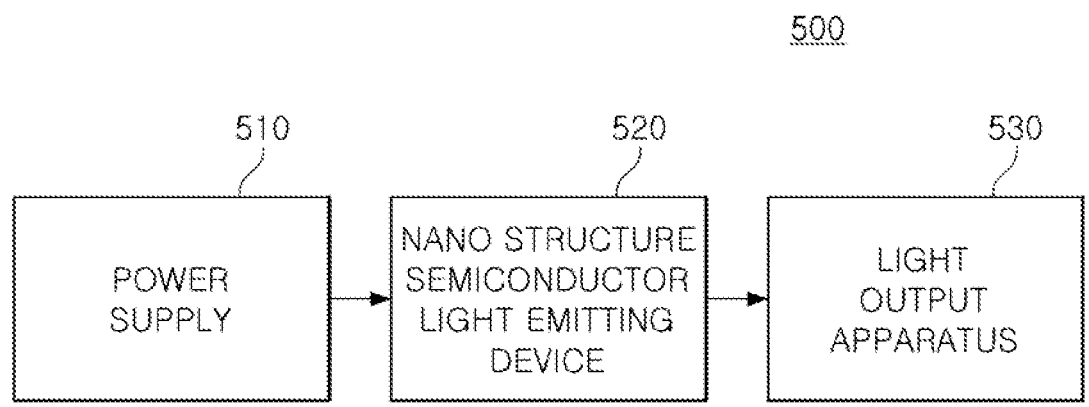
FIG. 8 is a block diagram of a system according to an exemplary embodiment of the present disclosure.

FIG. 8 is a block diagram of a system including a nanostructure semiconductor light emitting device according to an exemplary embodiment of the present disclosure.

Referring to FIG. 8, a system 500 may include a nanostructure semiconductor light emitting device 520, a power supply 510 providing electric power to the nanostructure semiconductor light emitting device 520, and a light output apparatus 530 through which the light generated by the nanostructure semiconductor light emitting device 520 comes out.

The power supply 510 may be an electric circuit, a capacitor, a chemical battery, a rechargeable battery, etc. The nanostructure semiconductor light emitting device 520 may be one of the nanostructure semiconductor light emitting devices described in the embodiments of the present disclosure. The light output apparatus 530 may be a display panel using the nanostructure semiconductor light emitting device 520 as a light source. The light output apparatus 530 may be an optical lens modifying the path of the light generated by the nanostructure semiconductor light emitting device 520. The light output apparatus 530 may be a data communication device using the nanostructure semiconductor light emitting device 520 as a light source to communicate with another device or to send out information from the system.

The system 500 may be an electronic system like a computer. The system 500 may be a data communication system. The system may be a mechanical system like a manufacturing machine or a motor vehicle. The motor vehicle may be a motorbike, a motor car or a ship.

Various advantages and effects in exemplary embodiments of the present disclosure are not limited to the above-described descriptions and may be easily understood through explanations of concrete embodiments of the present disclosure.

While exemplary embodiments have been shown and described above, it will be apparent to those skilled in the art that modifications and variations could be made without departing from the spirit and the scope of the present disclosure as defined by the appended claims.

What is claimed is:

1. A nanostructure semiconductor light emitting device comprising:
    a substrate including a light emitting region and a non-light emitting region; and
    a plurality of light emitting nanostructures disposed in the light emitting region and including,
        nanocores having a first conductivity type semiconductor,
        active layers disposed on the nanocores, and
        second conductivity type semiconductor layers disposed on the active layers,
    wherein the light emitting region includes a first region and a second region, and the non-light emitting region is disposed closer to the first region than the second region, and
    wherein a distance between immediately adjacent ones of the light emitting nanostructures disposed in the first region is smaller than a distance between immediately adjacent ones of the light emitting nanostructures disposed in the second region.

2. The nanostructure semiconductor light emitting device of claim 1, wherein the distance between the immediately adjacent ones of the light emitting nanostructures disposed in the first region is a function of at least one of the distance between the immediately adjacent ones of the light emitting nanostructures disposed in the second region and an area of the non-light emitting region.

3. The nanostructure semiconductor light emitting device of claim 1, wherein the distance between immediately adjacent ones of the light emitting nanostructures disposed in the first region is 0.8 to 0.95 of the distance between the immediately adjacent ones of the light emitting nanostructures disposed in the second region.

4. The nanostructure semiconductor light emitting device of claim 1, wherein the non-light emitting region includes at least a portion of a first electrode connected to a plurality of the nanocores, at least a portion of a second electrode connected to the second conductivity type semiconductor layers.

5. The nanostructure semiconductor light emitting device of claim 4, wherein at least one of the first electrode and the second electrode includes a pad part and at least one finger part extending from the pad part.

6. The nanostructure semiconductor light emitting device of claim 1, wherein the width of the first region is 15% or less of the length or the width of the light emitting region.

7. The nanostructure semiconductor light emitting device of claim 1, wherein the lateral surfaces of a plurality of the respective nanocores are nonpolar m-planes.

8. The nanostructure semiconductor light emitting device of claim 1, wherein the light emitting region includes a plurality of sub-regions emitting different wavelength bands of light from one another and at least one boundary region disposed between the sub-regions, and
    the width of the boundary region is substantially identical to the interval between the light emitting nanostructures disposed in one sub-region of the plurality of sub-regions adjacent to the boundary region, or an average value of the intervals between the light emitting nanostructures disposed in respective sub-regions adjacent to the boundary region.

9. A nanostructure semiconductor light emitting device comprising:
    a substrate including a non-light emitting region and a plurality of light emitting regions; and
    a plurality of light emitting nanostructures disposed in the light emitting regions and including,
        nanocores having a first conductivity type semiconductor,
        active layers disposed on the nanocores, and
        second conductivity type semiconductor layers disposed on the active layers,
    wherein respective pitches between the light emitting nanostructures disposed in the respective light emitting regions are different from one another.

10. The nanostructure semiconductor light emitting device of claim 9, wherein the plurality of light emitting regions include:
    a first light emitting region having a plurality of light emitting nanostructures spaced apart from one another by a first pitch;
    a second light emitting region having a plurality of light emitting nanostructures spaced apart from one another by a second pitch, different from the first pitch; and
    a third light emitting region having a plurality of light emitting nanostructures spaced apart from one another by a third pitch, different from the first pitch and the second pitch.

11. The nanostructure semiconductor light emitting device of claim 10, wherein the nanocores disposed in the respective first, second, and third light emitting regions have at least one of different widths from one another or different heights from one another.

12. The nanostructure semiconductor light emitting device of claim 10, wherein the pluralities of light emitting nanostructures disposed in the respective first, second and third light emitting regions are structured to generate light of different wavelengths from one another.

13. The nanostructure semiconductor light emitting device of claim 12, wherein the combination of the light of different wavelengths generated by the pluralities of light emitting nanostructures disposed in the respective first, second and third light emitting regions provides white light.

14. The nanostructure semiconductor light emitting device of claim 9, wherein a boundary between at least a first light emitting region and a second light emitting region has a width equal one of the pitch between the light emitting nanostructures in the first light emitting region, the pitch between the light emitting nanostructures in the second light emitting region, and the average of the pitch between the light emitting nanostructures in the first light emitting region and the pitch between the light emitting nanostructures in the second light emitting region.

15. The nanostructure semiconductor light emitting device of claim 9, wherein at least a portion of the plurality of light emitting regions includes a first region and a second region, and the non-light emitting region is disposed closer to the first region than the second region, and the pitch between the light emitting nanostructures disposed in the first region is smaller than the pitch between the light emitting nanostructures disposed in the second region.

16. A system comprising:

a nanostructure semiconductor light emitting device;

a power supply providing electric power to the nanostructure semiconductor light emitting device; and an output apparatus through which the light generated by the nanostructure semiconductor light emitting device comes out, wherein the nanostructure semiconductor light emitting device comprises, a substrate including a first light emitting region, a second light emitting region and a non-light emitting region, and a plurality of light emitting nanostructures disposed in the first and the second light emitting region, wherein the first light emitting region is closer to the non-light emitting region than the second light emitting region, and the interval between the light emitting nanostructures disposed in the first light emitting region is different from the interval between the light emitting nanostructures disposed in the second light emitting region.

17. The system of claim 16, wherein the system is an electronic system or a mechanical system.

18. The system of claim 17, wherein the output apparatus is a display panel using the nanostructure semiconductor light emitting device as a light source, an optical lens modifying the path of the light generated by the nanostructure semiconductor light emitting device, or a data communication apparatus using the nanostructure semiconductor light emitting device as a light source to communicate with another device or to send out information from the system.

19. The system of claim 16, wherein the system is a motor vehicle or a computer system.

20. The system of claim 16, wherein the nanostructure semiconductor light emitting device comprises a plurality of light emitting sub-regions each of which emits light of different wavelengths and the combination of the light waves emitted by the plurality of light emitting sub-regions composes a white light.

* * * * *